② United States Patent [19]
Abe et al.

[11] 3,822,409
[45] July 2, 1974

[54] PHOTOSENSITIVE SOLID OSCILLATOR

[75] Inventors: Toshiro Abe; Keizi Kakite, both of Osaka, Japan

[73] Assignee: Matsushita Electric Works, Ltd., Osaka, Japan

[22] Filed: Mar. 5, 1973

[21] Appl. No.: 338,336

Related U.S. Application Data

[63] Continuation of Ser. No. 148,309, June 1, 1971, abandoned.

[52] U.S. Cl................ 331/66, 307/311, 317/235 N, 317/235 AA, 331/107 R, 331/108 R

[51] Int. Cl. ............................................ H03b 7/06

[58] Field of Search...... 331/66, 107 R, 108 R, 111; 317/235 N, 235 T, 235 AA; 307/311

[56] References Cited

UNITED STATES PATENTS

| | | | |
|---|---|---|---|
| 3,379,940 | 4/1968 | Nakao | 317/235 AA X |
| 3,422,323 | 1/1969 | Whoriskey | 317/235 AA X |
| 3,665,340 | 5/1972 | Kojima et al | 331/107 R |

*Primary Examiner*—Herman Karl Saalbach
*Assistant Examiner*—Siegfried H. Grimm
*Attorney, Agent, or Firm*—Wolfe, Hubbard, Leydig, Voit & Osann, Ltd.

[57] ABSTRACT

A photosensitive solid oscillator which performs oscillation when a light irradiation is provided substantially at the side of main electrodes. The oscillator comprises a wafer consisting of a semiconductor material, a first impurity region of reverse conduction type to that of said semiconductor wafer and formed on the lower surface of the wafer, second and third impurity regions of reverse conduction type to that of the wafer and formed on two spaced parts of the upper surface of the wafer, a fourth impurity region of the same conduction type as the wafer and formed on the upper surface of one of said second and third impurity regions, first and second ohmic main electrodes provided respectively on the surfaces of said fourth impurity region formed on one of the second and third impurity regions and on the surface of the other one of said second and third impurity regions, and a DC voltage source is applied between said two main electrodes so that said voltage is in the reverse direction with respect to the junction between said wafer and said fourth impurity region on which the first main electrode is provided.

15 Claims, 18 Drawing Figures

INVENTORS.
TOSHIRO ABE
KEIZI KAKITE
BY
Wolfe, Hubbard, Leydig, Voit & Osann, Ltd.
ATTORNEYS.

INVENTORS.
TOSHIRO ABE
KEIZI KAKITE
BY
Wolfe, Hubbard, Leydig, Voit & Osann, Ltd.
ATTORNEYS.

PATENTED JUL 2 1974 3,822,409

INVENTORS.
TOSHIRO ABE
KEIZI KAKITE
BY
Wolfe, Hubbard, Leydig, Voit & Osann, Ltd.
ATTORNEYS.

INVENTORS.
TOSHIRO ABE
KEIZI KAKITE
BY
Wolfe, Hubbard, Leydig, Voit & Osann, Ltd.
ATTORNEYS INVENTORS.
TOSHIRO ABE
KEIZI KAKITE
BY
Wolfe, Hubbard, Leydig, Voit & Osann, Ltd.
ATTORNEYS.

PHOTOSENSITIVE SOLID OSCILLATOR

This is a continuation of application Ser. No. 148,309, filed June 1, 1971 and now abandoned.

This invention relates to improvements in photosensitive solid oscillators.

The present inventors have previously proposed a photosensitive solid oscillator element characterized in that a lower impurity region of a high impurity concentration is formed on one of the surfaces of a semiconductor wafer whose conductivity type is reverse to that of said impurity region, an upper impurity region whose conduction type is the same as that of said lower impurity region is formed on part of another surface of said wafer, electrodes are disposed on said upper impurity region and wafer respectively, a voltage is applied to said electrodes so that such voltage is in the reverse direction with respect to the junction between said wafer and upper impurity layer, and the oscillating frequency is modulated by light. In connection with this oscillator, a general object of the present invention is to provide an oscillator element in which the oscillation can be controlled over a wide range, and a large oscillating output can be obtained.

Figure 1:
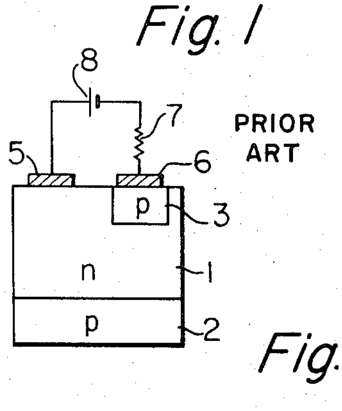
Figure 15:
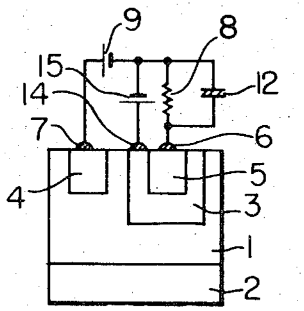
Figure 16:
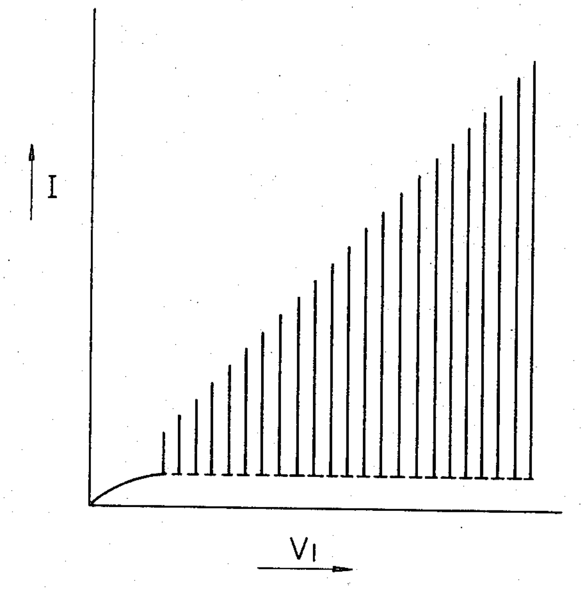
Figure 17:
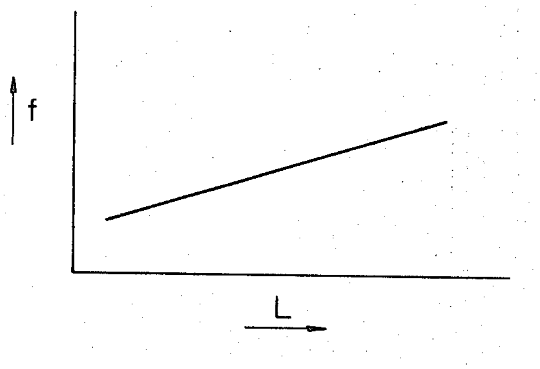
Figure 18:
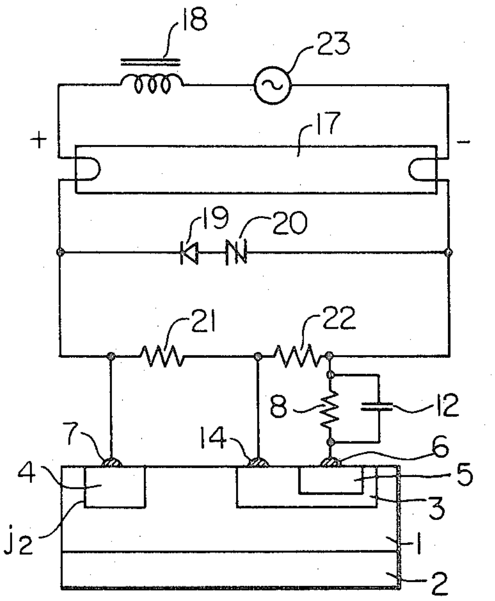

FIG. 1 shows the photosensitive solid oscillator previously proposed by the inventors, FIGS. 2–15 show various embodiments of the photosensitive solid oscillator according to the present invention, FIGS. 16 and 17 show characteristics of the solid oscillator according to the present invention, and FIG. 18 shows an example of electric circuit to which the photosensitive solid oscillator of the present invention is applied.

Referring to FIG. 1, there is shown the structure of a known photosensitive solid oscillator, wherein 1 is an *n*-type semiconductor wafer, 2 is a lower *p*-type impurity region, 3 is an upper *p*-type impurity region, 5 and 6 are ohmic electrodes, 8 is a DC source, and 7 is a resistor.

Figure 2:
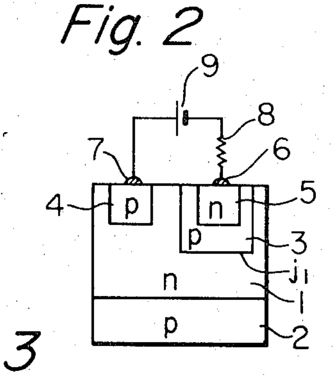

FIG. 2 shows an embodiment of the photosensitive solid oscillator according to this invention. In FIG. 2, a lower *p*-type impurity region 2 is formed on the lower surface of an *n*-type semiconductor wafer 1, *p*-type first and second upper impurity regions 3 and 4 are formed on two parts of the upper surface of said wafer, an *n*-type third upper impurity region 5 is further formed on the first *p*-type impurity region 3, an ohmic first main electrode 6 is provided on the surface of said *n*-type third upper impurity region 5, and an ohmic second main electrode 7 is provided on the surface of said second *p*-type impurity region 4.

In this embodiment of the invention, a main DC source 9 is connected between said main electrodes 6 and 7 through an output resistor 8, so that the voltage from said DC source is applied in the reverse direction with respect to the junction $j_1$ between said first *p*-type impurity region 3 and the *n*-type semiconductor wafer 1. The oscillator starts oscillating when the voltage $V_1$ of the DC source is increased to a certain definite value, and thus an oscillating voltage $V_1$ is obtained across the output resistor 8. Even before the voltage of the DC source reaches the oscillation starting voltage, however, the oscillator starts oscillating upon receiving light L on its surface including the electrode 6. This is because the internal constant of the oscillator is changed due to the light irradiation. The oscillating frequency *f* can be varied by changing the amount of light applied. This characteristic is shown in FIG. 16.

More detailed descriptions of such oscillating phenomenon will be given below referring to the V-I characteristic (FIG. 16) of the oscillator according to the present invention. The junction $j_1$ between the *p*-type first upper impurity region 3 and the *n*-type semiconductor wafer 1 will be a reverse junction against a DC voltage having a polarity as shown in FIG. 2. When a constant light amount L is applied to the element while applying a DC voltage of the polarity shown in FIG. 2, the junction $j_1$ repeats rapidly the conducting and non-conducting states, whereby, in the element, a region conducting the current $I_1$ determined by the DC source 9 and output resistor 8, and another region not conducting the current $I_1$ and thus supporting almost all the source voltage $V_1$ become present. The relationship between the source voltage $V_1$ and the current $I_1$ flowing in the element is represented by the V-I characteristic shown in FIG. 16. Thus, according to the invention, an ideal oscillating characteristic is obtained under the foregoing conditions.

An example of the oscillator according to the present invention will be disclosed below. Boron is diffused into one whole surface and into two parts of the other surface of an *n*-type semiconductor wafer 1 with a specific resistance of about 40Ω cm up to a depth of about 12$\mu$ and a concentration of $4 \times 10^{17}/cm^3$, so that *p*-type regions 2, 3 and 4 are formed. Phosphorus is further diffused into the surface of the *p*-type region 3 to a depth of about 6$\mu$ and a concentration of about $5 \times 10^{20}/cm^3$, whereby an *n*-type region 5 is formed. Nickel plating is then performed on the surfaces of the *p*-type impurity region 4 and *n*-type impurity region 5, respectively, so as to form ohmic electrodes 6 and 7. A DC voltage $V_1$ is applied via an output resistor 8 of 4*k*Ω between these main electrodes 6 and 7 of the photosensitive solid oscillator. When the voltage $V_1$ is increased, oscillation takes place at about 150V. If, on the other hand, this main source voltage $V_1$ is retained constant at 100V and light is irradiated adjacent the electrode, oscillation does not take place when only a small amount of light is being irradiated, but when the light is increased to a predetermined amount oscillation is started. Thereafter, the oscillating frequency becomes higher as the amount of light is increased, as shown in FIG. 17.

It should be appreciated here that, even when an AC source is utilized instead of the DC source 9, substantially the same operation as in the case of the DC source can be performed. This is applicable to all the embodiments to be disclosed below.

Figure 3:
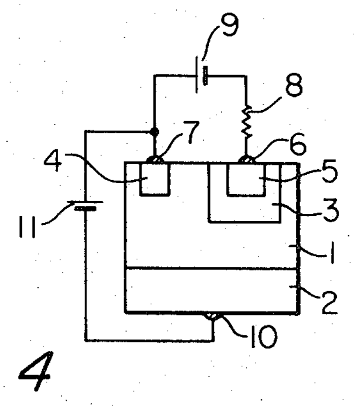

FIG. 3 shows another embodiment of this invention. According to this embodiment, an ohmic auxiliary electrode 10 is provided on the lower *p*-type impurity region 2, and an auxiliary DC source 11 is connected between the second main electrode 7 and the auxiliary electrode 10. In this arrangement, it is possible to have the oscillation take place by means of the voltage of the auxiliary DC source 11, that is, by a biasing voltage, without irradiation of light. Therefore, the oscillation can be effected by applying a low biasing voltage even with a low voltage of the main DC source 9 applied. That is, the oscillation starting voltage is independent of the main source voltage, but depends rather on a lower biasing voltage which is normally in the range of about 0.1 – 10V. Thus, the oscillating frequency can be arbitrarily or varied by varying the voltage of the auxiliary DC source, namely by changing the bias voltage. In addition, the oscillator is capable of performing the oscillation at a low oscillation starting voltage even when the light intensity is small. In other words, the sensitivity of the element against light can be made higher.

Figure 4:
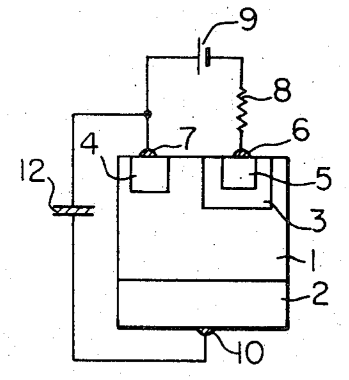

FIG. 4 illustrates another embodiment of this invention, wherein a capacitor 12 is connected between the auxiliary electrode 10 and the second main electrode 7. The oscillating frequency can be controlled by varying the capacity of this capacitor. Namely, the oscillating frequency is lowered with an increase in the capacity of the capacitor, or made higher with a decrease in the capacity of the capacitor.

Figure 5:
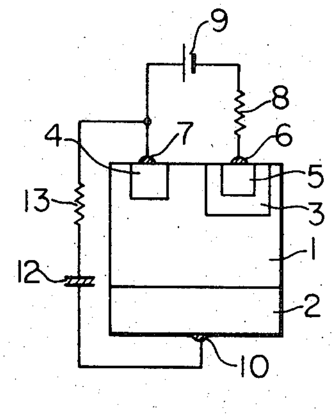

Another embodiment is shown in FIG. 5, wherein a resistor 13 and a capacitor 12 are connected in series between the auxiliary electrode 10 and the second main electrode 7. The oscillating frequency can be varied by varying the capacity of the capacitor and the resistance of the resistor. The oscillating frequency is lowered with an increase in the capacity of the capacitor or increased with a decrease in the capacity thereof. Also, the oscillating frequency is made higher by increasing the resistance of the resistor or decreased by decreasing the resistance value thereof.

Figures 6, 7, 8, 9, 10:
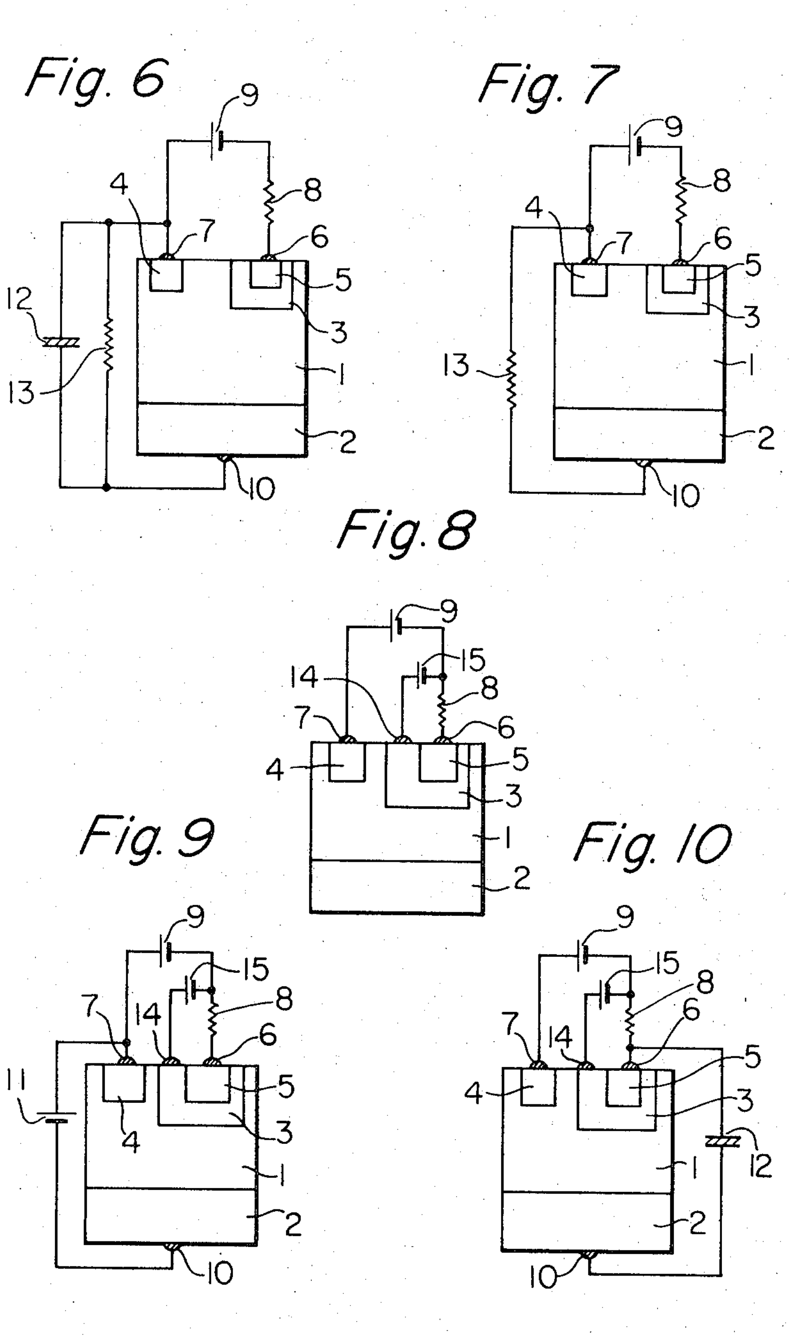

Another embodiment of the invention is shown in FIG. 6, wherein a capacitor 12 and a resistor 13 are connected in parallel to each other between the auxiliary electrode 10 and the second main electrode 7. The oscillating frequency is lowered with an increase in the capacity of the capacitor or made higher with a decrease in the capacity thereof. Also, the oscillating frequency is lowered with an increase in the resistance value of the resistor or made higher with a decrease in the resistance value.

Another embodiment of the invention is shown in FIG. 7, wherein a resistor 13 is connected between the auxiliary electrode 10 and the second main electrode 7. In this embodiment, the oscillating frequency is made higher with a decrease in the resistance value of the resistor or lowered with an increase in the resistance value.

FIG. 8 shows another embodiment of the invention, wherein an ohmic control electrode 14 is provided on the *p*-type first upper impurity region 3, a main DC source is connected through a resistor 8 between the main electrodes 6 and 7, and an auxiliary DC source 15 is connected directly or through said resistor 8 between the control electrode 14 and the first main electrode 6. By the application of said auxiliary DC source, the oscillation starting voltage can markedly be lowered. The oscillating frequency can be varied by varying the voltage of said auxiliary DC source, under the condition that the voltage of the main DC source is kept constant. In other words, the oscillating frequency can be made higher if the voltage from the auxiliary source is made higher.

FIG. 9 shows another embodiment of the invention wherein, in the embodiment of FIG. 8, an ohmic auxiliary electrode 10 is provided on the lower *p*-type impurity region 2, and the voltage from the bias source 11 is applied between the second main electrode 7 and the auxiliary electrode 10. According to this embodiment, the oscillating frequency can be arbitrarily varied by varying the bias voltage, and the sensitivity of the oscillator to the light can be increased.

Another embodiment of the invention is shown in FIG. 10, wherein a capacitor 12 is connected between the auxiliary electrode 10 and the first main electrode 6. The oscillating frequency can be controlled by varying the capacity of the capacitor 12. Namely, the oscillating frequency is lowered with an increase in the capacity of the capacitor, or made higher with a decrease in the capacity of the capacitor.

Figure 11:
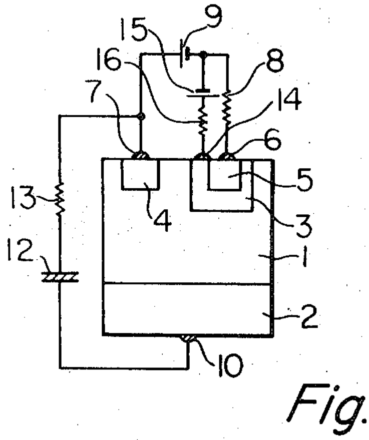

FIG. 11 shows another embodiment of the invention, wherein an auxiliary DC source 15 is connected via a resistor 16 between the control electrode 14 and the point at which the DC source 9 is connected to the resistor 8, and a resistor 13 and a capacitor 12 are connected in series between the auxiliary electrode 10 and the second main electrode 7. In this embodiment, the oscillating frequency can be varied by varying the values of the capacitor and resistor. Namely, the oscillating frequency is lowered with an increase in the capacity of the capacitor or made higher with a decrease in the capacitor value. Also, the oscillating frequency is made higher with an increase in the resistance value of the resistor or lowered with a decrease in the resistance value.

Figure 12:
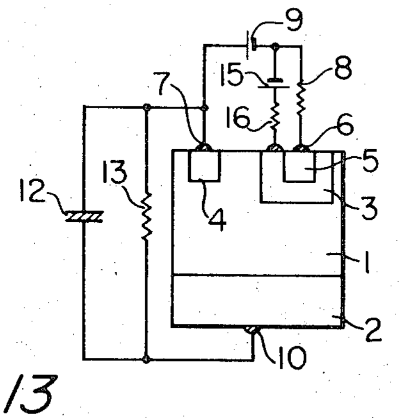

FIG. 12 shows another embodiment of the invention, wherein the capacitor 12 and resistor 13 in the embodiment of FIG. 11 are connected in parallel between the auxiliary electrode 10 and the second main electrode 7. In this embodiment, the oscillating frequency is lowered with an increase in the capacity of the capacitor or made higher with a decrease in the capacity of the capacitor. Also, the oscillating frequency is lowered with an increase in the resistance value of the resistor or made higher with a decrease in the resistance value.

Figure 13:
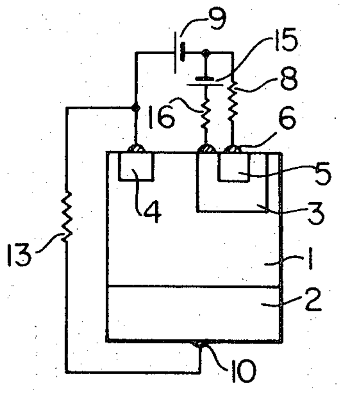

FIG. 13 shows another embodiment of the invention, wherein a resistor 13 is connected between the auxiliary electrode 10 and the second main electrode 7. In this arrangement, the oscillating frequency is made higher by decreasing the resistance value of the resistor or made lower by increasing the resistance value thereof.

Figure 14:
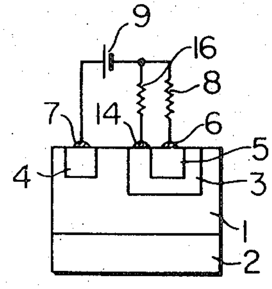

FIG. 14 shows another embodiment of the invention, wherein a resistor 16 is connected between the control electrode 14 and the junction point at which the DC source 9 is connected to the resistor 8. In the oscillating state, the oscillating frequency is lowered by decreasing the resistance value of the resistor 16 or made higher by increasing the resistance value thereof. In the case where the resistance value of the resistor 16 is small, the light intensity to effect the oscillation must be large, while, if the resistance value of the resistor is large, the light intensity may be small.

FIG. 15 shows a further embodiment of this invention, wherein only a DC source 15 is connected between the junction point of the DC source 9 with the resistor 8 and the control electrode 14, and a capacitor 12 is inserted in parallel with the resistor 8. According to this embodiment, the pulse width, pulse peak current and oscillating frequency can be easily controlled by selectively setting the capacitor and resistor. That is, the oscillating frequency is primarily determined by the capacitance value of the capacitor 12 in such manner that the frequency will be high when the capacitance is small and, on the other hand, the frequency will be lowered when the capacitance is made larger. Further, in the case when the capacitance value is constant, the frequency can be made lower by making the resistance value of the resistor 8 larger and can be made higher by making the resistance value smaller. The pulse width is controlled in such manner that the width will be increased to a large extent by making the capacitance value larger. The width can be also increased by increasing the bias voltage. In controlling the pulse width, therefore, it is possible to obtain a desired pulse width by varying the capacitance value, initially, and then precisely adjusting such varied width by means of the bias voltage. The peak current of the oscillation will be controlled in such manner that the oscillation output will be larger in accordance with increases in the capacitance value.

As described in the foregoing, the oscillator according to the present invention starts its oscillation when the voltage applied from the main DC source is increased above a certain predetermined value and the oscillation is retained with the voltage higher than such value, but the oscillation can be also started without making the voltage higher than the predetermined value of the oscillation starting voltage if a light is irradiated adjacent the main electrode, that is, with a lower voltage in the latter case than the oscillation starting voltage in the former case. With the light irradiation, further, it is possible to obtain such a further characteristic of the oscillator that the oscillating frequency is made higher by increasing the amount of light irradiation.

The oscillator according to the present invention is most remarkably featured in that the oscillation starting voltage can be lowered to a large extent, for instance, even to 2–3V with the provision of the auxiliary DC source and without the light irradiation. Further, the oscillating frequency can be selectively varied by varying the voltage applied from the auxiliary source in such a wide range of, for example, 0.05 KHz to several hundred KHz. Also, a large oscillating output can be derived from the oscillator, since the internal impedance of the oscillator element ranges from almost infinite value in its current blocking state to almost zero in its conducting state.

In the foregoing embodiments, *n*-type semiconductors may be used instead of the *p*-type semiconductors, or *p*-type semiconductors may be used instead of the *n*-type semiconductors.

Further, in the embodiments of FIGS. 3–7, 9 and 11–13, respectively, the resistor, capacitor or the auxiliary DC source connected between the second main electrode and the auxiliary electrode may be connected between the first main electrode and the auxiliary electrode. It will be appreciated that the above is also applicable to the embodiment of FIG. 10.

FIG. 18 shows an example of an electric circuit using the photosensitive solid oscillator according to the present invention. In the drawing, 17 is a discharge lamp, 18 is a ballast, 19 is a diode, 20 is an SSS element, 21 and 22 are resistors, and 23 is an AC source. Other reference figures 1–8, 12 and 14 indentify elements which are the same as those in the foregoing embodiments and indentified by corresponding figures.

When the polarity of the source voltage applied to the discharge lamp is as shown in the drawing, the current is made to flow only through the oscillator circuit and not through the SSS circuit since the current is blocked by the diode 19, so that the oscillator will perform the oscillation. Due to such oscillating current, a kick voltage is caused to be generated with an action of the ballast 18, which applies a high voltage to both filaments of the discharge lamp 17.

When the source voltage polarity is the reverse of the above case shown in FIG. 18, the source current flows only through the SSS circuit since the current is blocked due to the reverse junction $j_2$ between the regions 1 and 4. In this state, when the voltage exceeds the break-over voltage of the SSS element 20, the element 20 is caused to be "ON" and a preheating current is supplied to the filaments of the lamp 17.

Accordingly, the high voltage due to the kick voltage and the preheating current are alternately applied to the discharge lamp, so that the lamp is started instantaneously. Respective elements' constants are so selected that either one of the SSS and oscillator circuits will not operate with the voltage in the discharge lamp tube, so that after the lamp is started the discharge will be retained.

What is claimed is:

1. A photosensitive solid oscillator which performs its oscillation upon a light irradiation substantially at the side of main electrodes, which comprises a wafer consisting of a semiconductor material having a first type of conductivity selected from the group consisting of *n*-type conductivity and *p*-type conductivity; a first impurity region in said wafer having a conductivity type which is reverse to that of said wafer, said first impurity region being formed on one of the surfaces of said wafer, second and third impurity regions formed on two different parts of a second surface of said wafer and having a conductivity type which is reverse to that of said wafer, a fourth impurity region having the same conductivity type as said wafer and formed on a part of the surface of said third impurity region, an ohmic first main electrode provided on the surface of said fourth impurity region, an ohmic second main electrode provided on the surface of said second impurity region, and a DC voltage source applied between said two main electrodes, so that said voltage is in the reverse direction with respect to the junction between said wafer and said third impurity region.

2. An oscillator according to claim 1, which further comprises an ohmic auxiliary electrode provided on said first impurity region and a bias voltage applied between said auxiliary electrode and one of said main electrodes.

3. An oscillator according to claim 1, which includes an ohmic auxiliary electrode provided on said first impurity region and wherein a capacitor is connected between said auxiliary electrode and one of said main electrodes.

4. An oscillator according to claim 1, which includes an ohmic auxiliary electrode provided on said first impurity region and wherein a capacitor and a resistor are connected in series between said auxiliary electrode and one of said main electrodes.

5. An oscillator according to claim 1, which includes an ohmic auxiliary electrode provided on said first impurity region and wherein a capacitor and a resistor are connected in parallel between said auxiliary electrode and one of said main electrodes.

6. An oscillator according to claim 1, which includes an ohmic auxiliary electrode provided on said first impurity region and wherein a resistor is connected between said auxiliary electrode and one of said main electrodes.

7. An oscillator according to claim 1, wherein an ohmic control electrode is provided on said third impurity region, and a biasing current source is connected between said control electrode and said first main electrode.

8. An oscillator according to claim 7, wherein a resistor is connected in series with said biasing current source between said control electrode and said first main electrode.

9. An oscillator in accordance with claim 7, which further comprises an ohmic auxiliary electrode provided on said first impurity region, and a bias voltage is applied between said auxiliary electrode and one of the first and second main electrodes.

10. An oscillator in accordance with claim 7, which includes an ohmic auxiliary electrode provided on said first impurity region and wherein a capacitor is connected between said auxiliary electrode and one of the main electrodes.

11. An oscillator in accordance with claim 7, which includes an ohmic auxiliary electrode provided on said first impurity region and wherein a capacitor and a resistor are connected in series between said auxiliary electrode and one of the main electrodes.

12. An oscillator in accordance with claim 7, which includes an ohmic auxiliary electrode provided on said first impurity region and wherein a capacitor and a resistor are connected in parallel between said auxiliary electrode and one of the main electrodes.

13. An oscillator in accordance with claim 7, which includes an ohmic auxiliary electrode provided on said first impurity region and wherein a resistor is connected between said auxiliary electrode and one of the main electrodes.

14. An oscillator according to claim 7, wherein said biasing current source is connected between said control electrode and said first main electrode through a parallel connection of a capacitor and a resistor connected at one end to the first main electrode.

15. An oscillator according to claim 7, wherein said biasing current source is connected between said control electrode and said first main electrode through a resistor connected at one end to said first main electrode.

* * * * *